(12) United States Patent
Saitou et al.

(10) Patent No.: US 8,952,562 B2
(45) Date of Patent: Feb. 10, 2015

(54) CONTROLLER MOUNTED IN CONSTRUCTION MACHINE

(71) Applicants: Tomohiro Saitou, Hiratsuka (JP); Masahiko Hosaka, Hiratsuka (JP)

(72) Inventors: Tomohiro Saitou, Hiratsuka (JP); Masahiko Hosaka, Hiratsuka (JP)

(73) Assignee: Komatsu Ltd., Minato-ku, Tokyo (JP)

( * ) Notice: Subject to any disclaimer, the term of this patent is extended or adjusted under 35 U.S.C. 154(b) by 0 days.

(21) Appl. No.: 13/817,120

(22) PCT Filed: Oct. 29, 2012

(86) PCT No.: PCT/JP2012/077836
§ 371 (c)(1),
(2) Date: Feb. 14, 2013

(87) PCT Pub. No.: WO2014/045460
PCT Pub. Date: Mar. 27, 2014

(65) Prior Publication Data
US 2014/0077591 A1    Mar. 20, 2014

(51) Int. Cl.
*B60L 1/00* (2006.01)
*B60L 3/00* (2006.01)
*H02G 3/00* (2006.01)
*H05K 7/20* (2006.01)
*H05K 5/00* (2006.01)

(52) U.S. Cl.
CPC .......... *H05K 7/20854* (2013.01); *H05K 5/0069* (2013.01)
USPC .......................................................... 307/9.1

(58) Field of Classification Search
USPC .......................................... 307/9.1; 361/709
See application file for complete search history.

(56) References Cited

U.S. PATENT DOCUMENTS

| 3,364,395 A | 1/1968 | Donofrio et al. |
| 3,541,433 A * | 11/1970 | Davis ............................. 323/320 |
| 6,364,670 B1 | 4/2002 | Wickett et al. |

FOREIGN PATENT DOCUMENTS

| CN | 201038390 Y | 3/2008 |
| CN | 201360240 Y | 12/2009 |
| JP | 2000-156924 A | 6/2000 |
| JP | 2000156924 A | 6/2000 |
| JP | 2000-223856 A | 8/2000 |
| JP | 2000223856 A | 8/2000 |
| JP | 2005-143265 | 6/2005 |

(Continued)

OTHER PUBLICATIONS

Office Action issued Dec. 4, 2013 in corresponding German Patent Application No. 112012000142.7, including English Translation, 12 pages.
International Search Report dated Dec. 4, 2012 from International Application No. PCT/JP2012/077836, 2 pages.

(Continued)

*Primary Examiner* — Carlos Amaya
(74) *Attorney, Agent, or Firm* — Fish & Richardson P.C.

(57) ABSTRACT

A controller mounted in a construction machine such as a dump truck includes a case having an upper surface provided with a plurality of heat release fins and a connector receiver hole for receiving a receptacle connector. The heat release fin includes a first heat release fin and a second heat release fin that are provided mutually crosswise to define an intersection. A first connector disposition face including a corner defined by the intersection and facing an edge of the upper surface is provided on the upper surface. A height of the receptacle connector disposed on the first connector disposition face is lower than a height of the first heat release fin and the second heat release fin.

5 Claims, 6 Drawing Sheets

(56) References Cited

FOREIGN PATENT DOCUMENTS

| JP | 2005-143265 A | 6/2005 |
|----|---------------|--------|
| JP | 2005143265 A  | 6/2005 |

OTHER PUBLICATIONS

Office Action dated Aug. 18, 2014 in corresponding Chinese Patent Application No. 201280002451.8, 8 pages.

* cited by examiner

CONTROLLER MOUNTED IN CONSTRUCTION MACHINE

CROSS-REFERENCE TO RELATED APPLICATIONS

This application claims priority to International Application No. PCT/JP2012/077836 filed on Oct. 29, 2012, which application claims priority to Japanese Application No. 2012-207141, filed on Sep. 20, 2012. The contents of the above applications are incorporated herein by reference in their entireties.

TECHNICAL FIELD

The present invention relates to a controller mounted in a construction machine. More specifically, the present invention relates to an improvement in a case of a controller with a heat release fin.

BACKGROUND ART

Controllers that accommodate an electronic circuit board and the like in a case have been known in various fields. It is suggested that a plurality of heat release fins are provided on an upper surface of the case used for the controller in order to dissipate the heat from a heat-generating component (e.g. power transistor) installed on the electronic circuit board in the case (see, for instance, Patent Literature 1).

A connector housing for attaching a case-side connector (receptacle connector), a relay housing for attaching a relay and a fuse housing for attaching a fuse are provided on the upper surface of the case disclosed in Patent Literature 1 in addition to the heat release fin.

CITATION LIST

Patent Literature

Patent Literature 1 JP-A-2005-143265

SUMMARY OF THE INVENTION

Problems to be Solved by the Invention

However, though the connector housing of the case of Patent Literature 1 is lower than the heat release fin, when a connector is attached to the connector housing, the connector may protrude from the heat release fin. Thus, while being handled, the connector may be erroneously directly collided with surrounding components to be damaged, thus resulting in a failure for attaching a cable-side connector (plug connector).

Further, especially in a construction machine, since the controller with the case is disposed in a narrow area and a maintenance work accompanying a detachment of the controller is performed in a less tidy work site, even a seasoned serviceman has to pay close attention for handling the controller, thereby causing much trouble over the work.

It should be noted that the relay housing of Patent Literature 1 itself protrudes higher than the heat release fin, so that the relay disposed in the relay housing is also likely to be damaged while the controller is handled.

Further, though the connector housing is provided in a pair along a side of the case in Patent Literature 1, when a more number of connector housings are to be provided, the connector housings have to be more densely disposed around the heat release fin.

However, the dense arrangement of the large number of connector housings causes the connector housings to be located closer to the heat release fin. Thus, the heat release fin may be covered with a cable harness wired through the connector housing and the like, thereby impairing the heat radiation performance.

An object of the invention is to provide a controller used for a construction machine, the controller being capable of keeping favorable radiation performance and securely avoiding damages on a connector.

Means for Solving the Problems

A controller according to a first aspect of the invention is mounted in a construction machine, the controller including: a case provided with a surface on which a plurality of heat release fins and a connector receiver hole for receiving a connector are provided, where the heat release fin comprises a first heat release fin and a second heat release fin mutually intersected at an intersection and disposed in a crossing direction, a connector disposition face comprising a corner defined by the intersection and facing an edge of the surface is defined on the surface, and a height of the connector disposed on the connector disposition face is lower than a height of the first heat release fin and a height of the second heat release fin.

The "surface" herein means a heat radiation surface suitable for heat radiation, which specifically is one of faces of the case with a large area. Accordingly, when a flat rectangular parallelepiped case is used, though an upper surface or a lower surface when the case is laid flat is eligible for the surface of the above aspect of the invention, the surrounding side faces with a small area is not eligible for the surface of the above aspect of the invention.

In a controller according to a second aspect of the invention, the first heat release fin and the second heat release fin are continuous with each other.

In a controller according to a third aspect of the invention, the first heat release fin and the second heat release fin are provided to define a T-shape.

A controller according to a fourth aspect of the invention is mounted in a construction machine, the controller including: a case provided with a surface on which a plurality of heat release fins and a connector receiver hole for receiving a connector are provided, where the surface is rectangular in a plan view, the heat release fin comprises a first heat release fin and a second heat release fin mutually intersected at an intersection and disposed in a crossing direction, the first heat release fin and the second heat release fin are continuous with each other and are provided to define a T-shape, three ends of the T-shape extending to two long-side edges and one short-side edge of the surface, the surface is defined thereon with: a pair of first connector disposition faces each comprising a corner defined by the intersection and facing one of the long-side edges and the short-side edge; and a second connector disposition face provided outside an area defined by the first heat release fin and the second heat release fin and facing the other short-side edge of the surface, a plurality of the connector receiver holes are provided on the pair of first connector disposition face and the second connector disposition face, and a height of the connector disposed on the first and second connector disposition faces is lower than a height of the first heat release fin and a height of the second heat release fin.

According to the first aspect of the invention, the connector displaced on the connector disposition face is surrounded by the first and second heat radiation fins defining the connector disposition face and has a height lower than the height of the first and second heat release fins. Accordingly, even when the controller is, for instance, dropped onto a floor from the surface while the controller is handled in a less tidy work space, since the first and second heat radiation fins collide with the floor, the connector does not hit the floor, thereby effectively protecting the connector. Further, since the connector disposition face faces the edge of the surface, a cable harness connected to the connector and the like can be wired through the edge, so that the cable harness does not cover the heat release fin and heat radiation performance is not impaired.

According to the second aspect of the invention, since the first and second heat radiation fins are continuously provided, the heat radiation fins can be reinforced to improve impact resistance. For instance, when the second heat release fin is provided by a single fin as in a later described exemplary embodiment, since the second heat release fin is continuous with the first heat release fin to be reinforced, even when only the second heat release fin first collides with the floor when the controller is dropped, the deformation and damage of the second heat release fin can be restrained.

According to the third aspect of the invention, since the first and second heat release fins are provided in a T-shape, a pair of mutually spaced connector disposition faces are defined. Thus, a plurality of the connectors disposed on each of the connector disposition faces can be wired through the edge to which each of the connector disposition face faces, so that larger number of cable harnesses can be wired while keeping heat radiation performance.

According to the fourth aspect of the invention, the same advantages as those of the first to third aspects of the invention can be provided. In addition, since the second connector disposition face is provided, a large number of connectors can be disposed, thereby allowing more number of cable harnesses to be wired.

DESCRIPTION OF EMBODIMENT(S)

Exemplary embodiment(s) of the invention will be described below with reference to the attached drawings.

Figure 1:
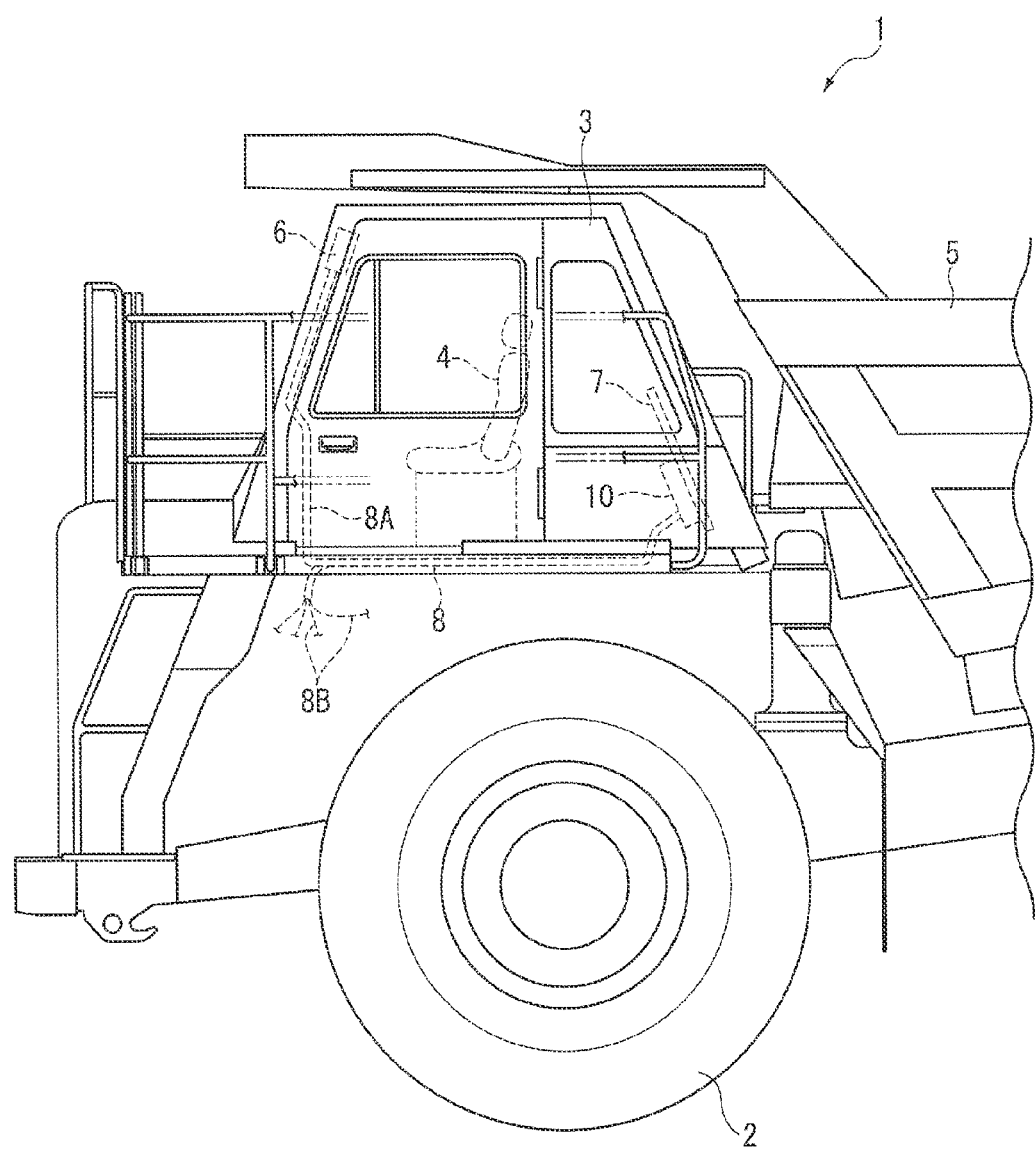
FIG. 1 is a side elevation showing a part of a construction machine according to an exemplary embodiment of the invention.
Figure 2:
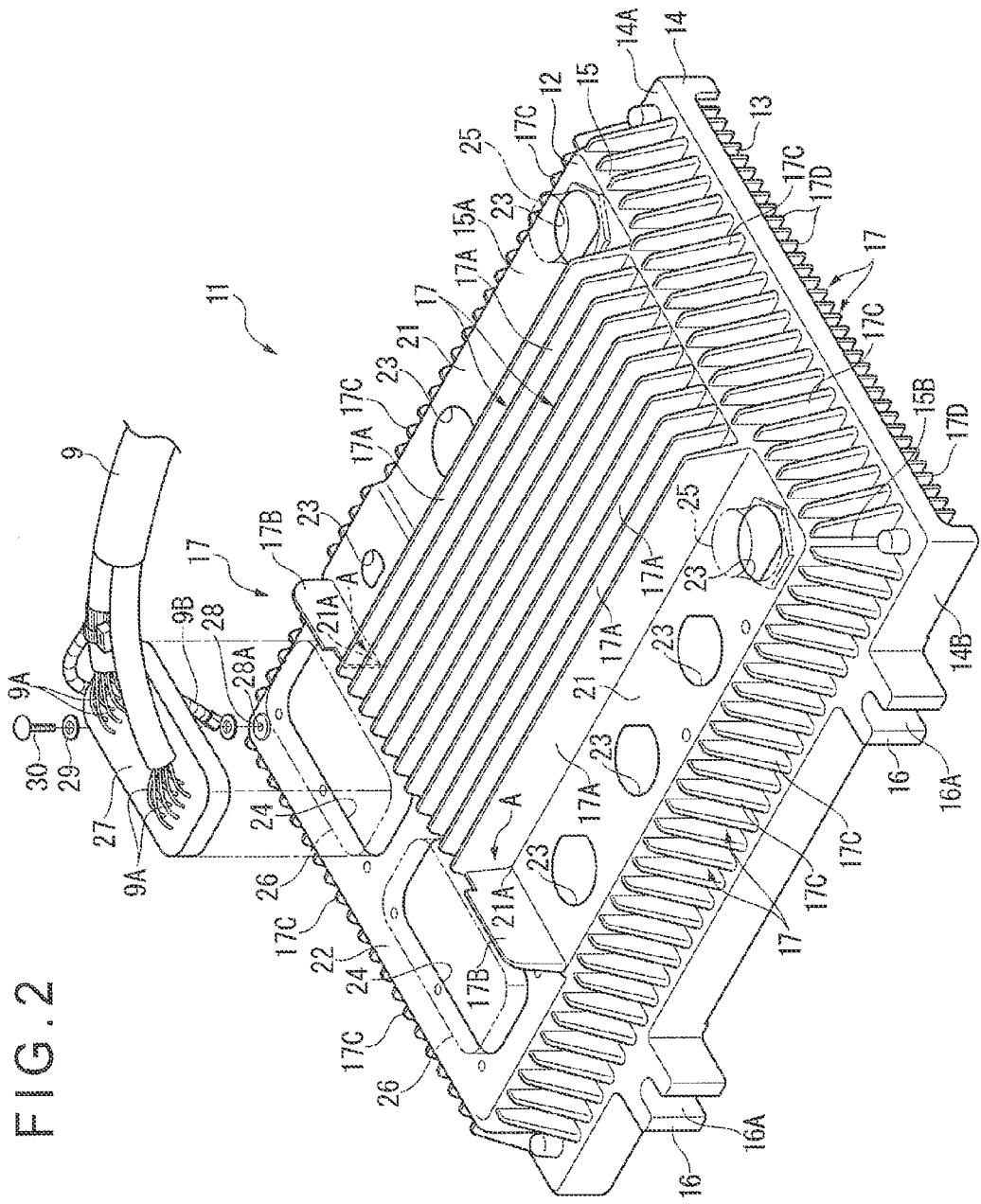
FIG. 2 is a perspective view showing a case of a controller mounted in the construction machine.

FIG. 1 shows a front part of a rigid dump truck (a construction machine in this exemplary embodiment).

As shown in FIG. 1, a dump truck 1 is provided with a cab 3 for an operator to get in at a position above a front wheel 2. Devices and machineries for traveling the dump truck 1 and tilting a body 5 are provided in the cab 3 in addition to an operator's seat 4 shown in a dotted line. Further, a monitor 6 shown in a dotted line is placed at an upper front part of an interior of the cab 3. A metal attachment board 7 is provided at a lower rear part of the interior of the cab 3. A controller 10 is attached to the attachment board 7.

The monitor 6 and the controller 10 are connected by a monitor cable 8A. An end of an image-signal cable 8B is connected to the controller 10. The other end of the image-signal cable 8B is connected to a plurality of monitoring cameras (not shown) mounted in the vehicle. The monitor cable 8A and the image-signal cable 8B are integrated into a cable harness 8. The image signals from the respective monitoring cameras are inputted to the controller 10 through the image-signal cable 8B. A predetermined processing is performed by the controller 10 based on the inputted image signals to generate display signals to be displayed on the monitor 6. The generated display signals are outputted to the monitor 6 through the monitor cable 8A to be displayed in a form of a desired image. In other words, the controller 10 in this exemplary embodiment is an image-processing controller.

Figure 3:
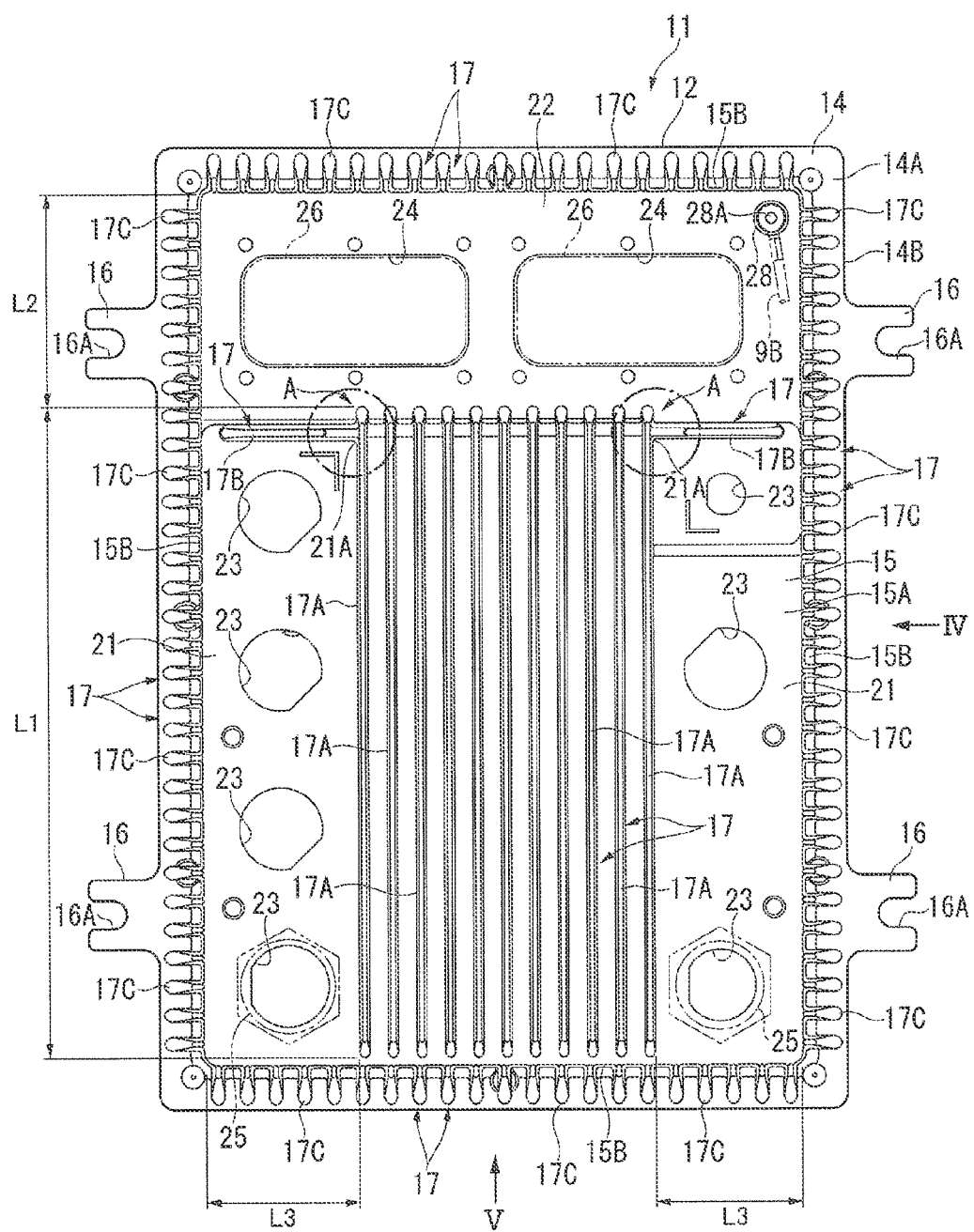
FIG. 3 is a plan view of the case.
Figure 4:
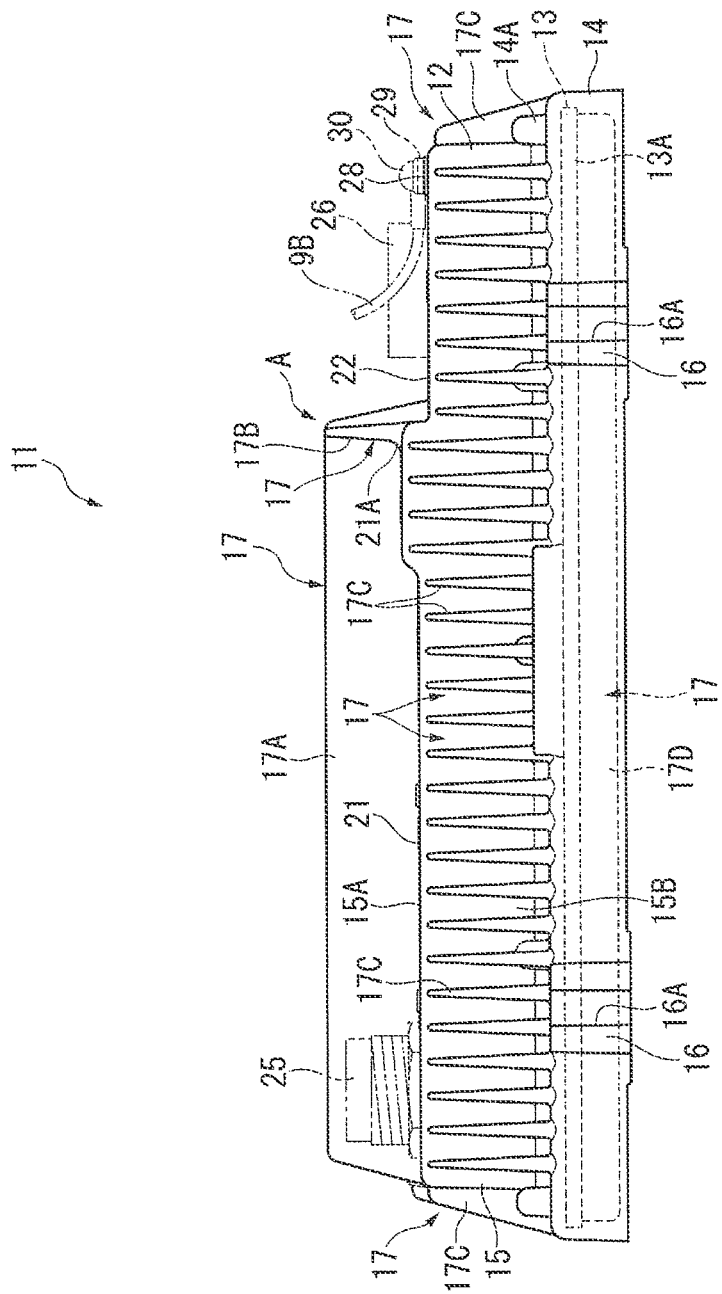
FIG. 4 is a side elevation of the case that is seen in a direction indicated by an arrow IV in FIG. 3.

FIGS. 2 to 5 show a case 11 of the controller 10 respectively in a form of a perspective view, a plan view, a side elevation seen in a direction of an arrow IV in FIG. 3 and another side elevation seen in a direction of an arrow V in FIG. 3.

As shown in FIGS. 2 to 5, the case 11 includes an upper case 12 in a form of a bottomless box and a lower cover 13 that is screwed to close a lower side of the upper case 12. Both of the upper case 12 and the lower cover 13 are made of aluminum die-casting.

A rectangular (in plan view) base 14 is provided on the upper case 12. An upwardly raised case body 15 is provided on an upper surface 14A of the base 14. Mounts 16 having a notch 16A in a form of an elongated hole horizontally project outward from side surfaces 14B of a pair of opposing long sides of the base 14. The entirety of the controller 10 is detachably attached to an attachment board 7 (FIG. 1) with bolts inserted through the notches 16A of the mounts 16.

On the other hand, an interior of the case body 15 similarly in a form of a rectangle (in plan view) defines an internal space of a predetermined volume. An electronic circuit board for generating the display signals of the monitor 6 is housed in the internal space. An integrated circuit such as an FPGA (Field-Programmable Gate Array) designed for image-processing is installed on the electronic circuit board. Since the electronic circuit board on which the integrated circuit is mounted is a heat-releasing component, in order to promote heat radiation from the heat-releasing component, a large number of heat release fins 17 (17A,17B,17C,17D) are provided on the upper case 12 and the lower cover 13.

Specifically, a plurality of first heat release fins 17A parallel to edges of the long sides protrude from an upper surface 15A of the case body 15. The first heat release fins 17A have a length dimension L1. A first longitudinal end of the first heat release fins 17A reaches near an edge of one of short sides of the case body 15 while a second end thereof is spaced apart from an edge of the other one of the short sides of the case body 15 by a predetermined dimension L2. The predetermined dimension L2 of the spaced-apart portion is sized to be adapted to receive a later-described receptacle connector 26.

Further, the plurality of first heat release fins 17A (sometimes collectively referred to as first heat release fin 17A hereinafter) are juxtaposed along the short sides of the case body 15 and are centrally concentrated as a whole. In other words, the first heat release fin 17A is spaced apart from the edges of the long sides of the case body 15 by a predetermined dimension L3 on both sides in the juxtaposing direction (i.e.

a direction in which the short sides extend). The predetermined dimension L3 is sized to be adapted to receive a later-described receptacle connector 25 and the like.

Further, a pair of second heat release fins 17B are provided on the upper surface 15A in the proximity of an end of the first heat release fin 17A near the receptacle connectors 26. The upper ends of the first and second heat release fins 17A and 17B are at the same height. The second heat release fins 17B extend in an insertion direction at a right angle relative to the first heat release fins 17A.

Specifically, a first end of one of the second heat release fins 17B continuously extends at a right angle from one of the first heat release fins 17A on a first side in the juxtaposing direction and a second end of the one of the second heat release fins 17B reaches near an edge of one of the long sides. Similarly, a first end of the other of the second heat release fins 17B extends at a right angle from one of the first heat release fins 17A on a second side in the juxtaposing direction and a second end of the one of the second heat release fins 17B reaches near an edge of the other of the long sides.

Thus, the first and second heat release fins 17A and 17B have intersections A at a portion encircled in FIG. 3 and are arranged in a T-shape in a plan view as a whole. Three ends of the T-shape extend to the both the edges of the longer sides and the edge of one of the short sides of the upper surface 15A. Incidentally, a plurality of rib-shaped third heat release fins 17C are provided on four side surfaces 15B of the case body 15 in a manner bridging across an upper surface 14A of the base 14. Further, a plurality of fourth heat release fins 17D are provided on a lower surface 13A of the lower cover 13 (FIGS. 4 and 5) facing downward.

Figure 5:
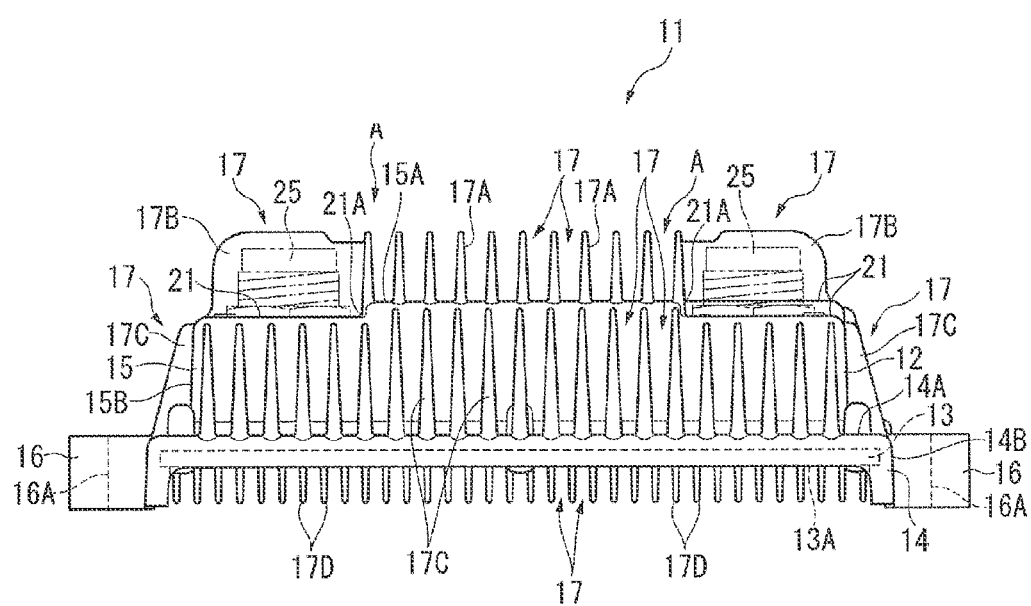
FIG. 5 is another side elevation of the case that is seen in a direction indicated by an arrow V in FIG. 3.

The fourth heat release fins 17D extend in parallel to an edge of long sides of the rectangular (in plan view) lower cover 13 and are provided all over the lower surface 13A. As shown in FIG. 5, an end of each of the fourth heat release fins 17D does not protrude from a lower surface (an attachment surface) of the mount 16 so as not to inhibit the controller 10 from being attached to the attachment board 7 (FIG. 1). The fourth heat release fin 17 is exposed from an opening at the short sides of the base 14, so that the radiated heat is dissipated through the opening between the base 14 and the attachment board 7.

The upper case 12 of this exemplary embodiment is arranged as follows for protecting the connector.

In the upper case 12, the first and second heat release fins 17A and 17B are placed on the upper surface 15A of the case body 15 in a T-shape, so that a pair of corners 21A defined by the intersections A of the first and second heat release fins 17A and 17B are formed on the upper surface 15A (the "surface"). The area partitioned by the first and second heat release fins 17A and 17B define a pair of first connector disposition faces 21 including the corner 21A. The first connector disposition faces 21 are provided on both sides of the area in which the heat release fin 17A is provided, so that first connector disposition faces 21 face both the edge of the long side and the edge of the short side of the upper surface 15A.

Further, a second connector disposition face 22 located outside the area defined by the first and second heat release fins 17A and 17B and facing an edge of the other short side (i.e. an edge of the side to which the first heat release fin 17A is not extended) is provided on the upper surface 15A. Specifically, the second connector disposition face 22 is an area corresponding to the above-mentioned dimension L2, and is at a height slightly lower than that of the first connector disposition face 21.

A plurality of substantially circular connector receiver holes 23 are provided on the first connector disposition face 21. However, according to a specification of the controller 10, a part of the connector receiver holes 23 is sometimes used as an access hole in order to inspect, for instance, lighting condition of an LED installed on the electronic circuit board provided therein. A pair of rectangular connector receiver holes 24 are provided on the second connector disposition face 22.

As indicated in a two-dot chain line, a connector in a form of the receptacle connector 25 is disposed in the connector receiver hole 23 on the first connector disposition face 21. A plug connector attached with the monitor cable 8A (FIG. 1) is connected to the receptacle connector 25 on one of the first connector disposition faces 21. A plug connector attached with the image-signal cable 8B (FIG. 1) is connected to the receptacle connector 25 on the other of the first connector disposition faces 21.

When the receptacle connector 25 is attached, the height of the receptacle connector 25 is lower than the height of the first and second heat release fins 17A and 17B, so that an upper part of the receptacle connector 25 is not protruded from the first and second heat release fins 17A and 17B. Though the connector(s) disposed in the other connector receiver holes 23 is not illustrated, the relationship between the height of the non-illustrated connector(s) and the height of the first and second heat release fin 17A and 17B is the same as the above. The connectors not illustrated may not be the same as the receptacle connector 25, but may alternatively be a network cable connector or a USB (Universal Serial Bus) cable connector.

As indicated in a two-dot chain line, a receptacle connector 26 is disposed in the connector receiver hole 24 on the second connector disposition face 22. A plug connector 27 of a cable harness 9 is connected to the receptacle connector 26. The cable harness 9 is provided by integrating a plurality of conduction cables 9A including a power cable for supplying power to the electronic circuit board and a signal cable used for signal transmission between peripherals, and a ground cable 9B for a frame ground.

The height of the receptacle connector 26 is also lower than the height of the first and second heat release fins 17A and 17B when the receptacle connector 26 is attached to the connector receiver hole 24, so that an upper part of the receptacle connector 26 is not protruded from the first and second heat release fins 17A and 17B.

As described above, the height of the receptacle connectors 25 and 26 and the other connectors is lower than the height of the first and second heat release fins 17A and 17B in this exemplary embodiment. Thus, when the maintenance work of the controller 10 is performed in a narrow and less tidy work space in the cab 3 behind the operator's seat 4, even if the controller 10 is dropped so that the upper surface 15A hits the floor of the cab 3 (e.g. while handling the controller 10 without the cable harnesses 8 and 9 being connected), the first and second heat release fins 17A and 17B hit the floor. Thus, the connectors such as the receptacle connectors 25 and 26 do not collide with the floor, thereby avoiding the damages on the connectors.

Further, since the first and second connector disposition faces 21 and 22 on which the receptacle connectors 25 and 26 and the like are placed face the edges of the upper surface 15A, the cable harnesses 8 and 9 are wired from the first and second connector disposition faces 21 and 22 through the edges toward the outside. Thus, the first and second heat release fins 17A and 17B are not covered by the cable harnesses 8 and 9, so that the heat radiation performance is not impaired.

The upper case 12 of this exemplary embodiment further includes a connecting portion 28 for connecting the ground cable 9B near one of the connector receiver holes 24 on the upper surface 15A of the case body 15. An internal thread 28A is provided on the connecting portion 28. A screw 30 is inserted to a terminal of the ground cable 9B via a washer 29. The screw 30 is screwed into the internal thread 28A. Thus, the ground cable 9B is connected with the upper case 12, so that the entire case 11 including the lower cover 13 is grounded with the frame ground.

The case 11 has been typically grounded by, when the controller 10 is attached to the attachment board 7, holding the terminal of the ground cable 9B between the mount 16 provided to the upper case 12 and the attachment board 7 and fastening the terminal together with the mount 16 to electrically conduct the ground cable 9B and the case 11. On the other hand, the connecting portion 28 dedicated for the ground cable 9B is provided on the upper case 12 of the case 11 in this exemplary embodiment.

Thus, when the cable harness 9 is temporarily detached from the controller 10 in a narrow work space in this exemplary embodiment, it is not necessary to detach a large bolt for attaching the controller 10 but it is only necessary to detach the dedicated screw 30, so that the maintenance work can be facilitated. Further, when the ground cable 9B is to be connected, since the screw 30 can be fastened while visually checking the fastening portion of the terminal, the terminal can be firmly connected to the case 11 to ensure the electrical conduction between the ground cable 9B and the case 11, thereby stably grounding the case 11 to the frame ground.

Incidentally, it should be understood that the scope of the invention is not limited to the above-described exemplary embodiment(s) but includes modifications and improvements as long as the modifications and improvements are compatible with the invention.

Figure 6A:
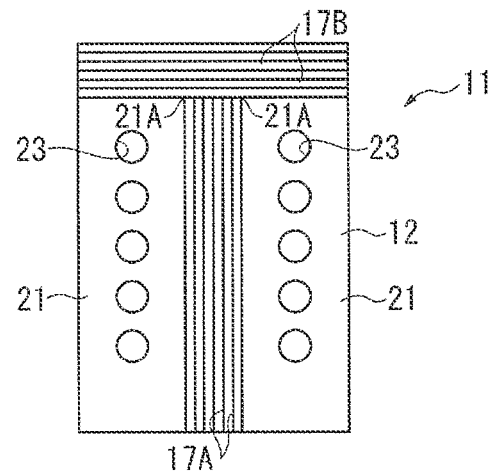
FIG. 6A is a plan view schematically showing a modification of the invention.

For instance, though the first and second heat release fins 17A and 17B are disposed in a T-shape so as to define the first and second connector disposition faces 21 and 22 on the upper surface 15A in the above exemplary embodiment, the first and second heat release fins 17A and 17B may be disposed in a T-shape all over the upper surface 15A so that only the pair of first connector disposition faces 21 are defined, as shown in FIG. 6A.

Figure 6B:
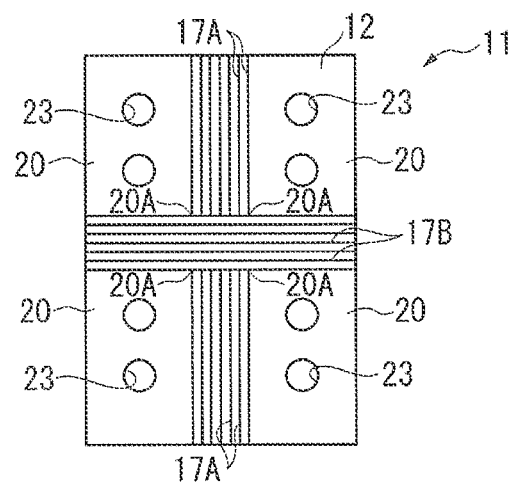
FIG. 6B is a plan view schematically showing another modification of the invention.
Figure 6C:
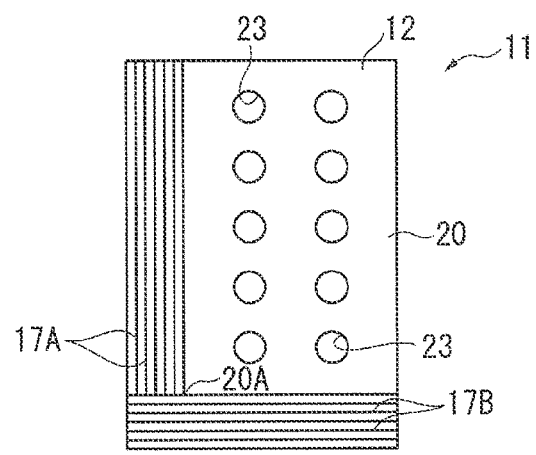
FIG. 6C is a plan view schematically showing still another modification of the invention.

Alternatively, as shown in FIG. 6B, the first and second heat release fins 17A and 17B may be disposed crosswise to define four connector disposition faces 20. Further alternatively, as shown in FIG. 6C, the first and second heat release fins 17A and 17B may be disposed in an L-shape to define a single large connector disposition face 20. Incidentally, the numeral "20A" in the figure denotes a corner portion.

In the above exemplary embodiment, the second heat release fin 17B is continuous with a part of the first heat release fins 17A. However, a small gap may be provided between the first and second heat release fins 17A and 17B and the first and second heat release fins 17A and 17B may be discontinuous thereat in an example of the invention.

Though the connecting portion 28 for connecting the ground cable 9B is provided at a single point in the above exemplary embodiment, for instance, a pair of connecting portions may be provided on a surface of the case being diagonally spaced apart from each other in order to ensure the grounding of the case with the frame ground. In the above arrangement, each of the cable harnesses connected to the connector near respective one of the connecting portions includes a ground cable.

In addition, the number of the connector receiver hole(s), the type of the connector and the cable harness, and the function of the electronic circuit board housed in the case are not limited to what has been described in the exemplary embodiment but may be determined as desired in view of the usage of the controller and the like.

The invention claimed is:

1. A controller mounted in a construction machine, the controller comprising:
   a case provided with a surface on which a plurality of heat release fins and a connector receiver hole for receiving a connector are provided, wherein
   the heat release fin comprises a first heat release fin and a second heat release fin that are disposed in a crossing direction and are mutually intersected at an intersection,
   at least one end of the first heat release fin extends to a first edge of the surface and at least one end of the second heat release fin extends to a second edge of the surface,
   the surface includes a connector disposition face having a corner that is defined by the intersection of the first and second heat release fins, and
   respective heights of the first and second heat release fins each are greater than a height of the connector disposed in the connector receiver hole.

2. The controller mounted in a construction machine according to claim 1, wherein
   the first heat release fin and the second heat release fin are continuous with each other.

3. The controller mounted in a construction machine according to claim 1, wherein
   the first heat release fin and the second heat release fin are provided to define a T-shape.

4. A controller mounted in a construction machine, the controller comprising:
   a case provided with a surface on which a plurality of heat release fins and a connector receiver hole for receiving a connector are provided, wherein
   the surface is rectangular in a plan view, the surface having a pair of opposing long edges and a pair of opposing short edges,
   the heat release fin comprises a first heat release fin and a second heat release fin mutually intersected at an intersection and disposed in a crossing direction,
   the first heat release fin and the second heat release fin are continuous with each other and are provided to define a T-shape, the opposing first and second ends of the T-shape extending to the two long edges of the surface, respectively, and the third end of the T-shape extending to one of the two short edges of the surface,
   the surface is defined thereon with: a pair of first connector disposition faces each comprising a corner defined by the intersection and facing each of the long edges and the one of the two short edges; and a second connector disposition face provided outside an area defined by the first heat release fin and the second heat release fin and facing the other of the two short edges of the surface,
   a plurality of the connector receiver holes are provided on the pair of first connector disposition face and the second connector disposition face, and
   a height of the connector disposed on the first and second connector disposition faces is lower than a height of the first heat release fin and a height of the second heat release fin.

5. The controller mounted in a construction machine according to claim 1, further comprising the connector configured to be received in the connector receiver hole.

* * * * *